(12) United States Patent
Wang

(10) Patent No.: US 6,710,448 B2
(45) Date of Patent: Mar. 23, 2004

(54) BONDING PAD STRUCTURE

(75) Inventor: Kun-Chih Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/880,518

(22) Filed: Jun. 12, 2001

(65) Prior Publication Data

US 2002/0180056 A1 Dec. 5, 2002

(30) Foreign Application Priority Data

Jun. 5, 2001 (TW) ........................... 90113549 A

(51) Int. Cl.[7] ................. H01L 29/40; H01L 29/00
(52) U.S. Cl. ............... 257/758; 257/508; 257/781; 257/750; 257/779
(58) Field of Search .............. 257/781, 758, 257/750, 508, 753, 765, 760, 771, 774, 770, 752, 784, 751, 764, 763

(56) References Cited

U.S. PATENT DOCUMENTS 6,100,573 A * 8/2000 Lu et al.

6,297,563 B1 * 10/2001 Yamaha

* cited by examiner

Primary Examiner—Long Pham
Assistant Examiner—DiLinh Nguyen
(74) Attorney, Agent, or Firm—Charles C. H. Wu; Wu & Cheung, LLP.

(57) ABSTRACT

A bonding pad structure. The bonding pad structure includes independently built current conduction structure and mechanical support structure between a bonding pad layer and a substrate. The current conduction structure is constructed using a plurality of serially connected conductive metallic layers each at a different height between the bonding pad layer and the substrate. The conductive metallic layers connect with each other via a plurality of plugs. At least one of the conductive metallic layers connects electrically with a portion of the device in the substrate by a signal conduction line. The mechanical support structure is constructed using a plurality of serially connected supportive metallic layers each at a different height between the bonding pad layer and the substrate. The supportive metallic layers connect with each other via a plurality of plugs. Furthermore, the mechanical support structure connects with a non-device section of the substrate so that stresses on the bonding pads are distributed evenly through the substrate.

15 Claims, 1 Drawing Sheet

BONDING PAD STRUCTURE

CROSS-REFERENCE TO RELATED APPLICATION

This application claims the priority benefit of Taiwan application Ser. No. 90113549, filed on Jun. 5, 2001.

BACKGROUND OF THE INVENTION

1. Field of Invention

The present invention relates to a bonding pad structure. More particularly, the present invention relates to a bonding pad structure having detached current conduction regions and mechanical support regions.

2. Description of Related Art

In the front stage of fabricating semiconductor devices, a plurality of optical masks is used to pattern out the active regions, gate structures, metallic layers, source/drain contacts, circuit pattern of multi-level interconnects and bonding pad windows. Due to the rapid increase in the level of integration of semiconductor devices, functional capacity and data processing speed, the number of signaling points on a semiconductor component increases considerably. As the number of contact points increases, the number of corresponding bonding pads required is also increased. After the formation of bonding pads, the integrated circuit chip must be packaged. In other words, the signal points and bonding pads on the silicon chip must connect electrically with a lead frame via metallic wires, a process known as wire-bonding. A wire-bonding operation links each bonding pad on a semiconductor chip with an inner lead of the lead frame using a fine metallic wire (30–50μm). Hence, electrical signal generated inside the semiconductor chip can be transmitted to circuits outside the package. The bonding pad on the semiconductor chip serves as a first bonding point while the inner lead of the lead frame serves as a second bonding point. During wire bonding, one end of a metallic wire is melted into a spherical blob and then the spherical blob is pressed onto the bonding pad to form a weld with the aid of an ultrasonic vibration. The metallic wire is pulled along a pre-defined path towards a corresponding inner lead position on the lead frame. Thereafter, the other end of the wire is bonded to the inner lead. Finally, excess metallic wire is pulled off from the bonded inner lead. By repeating the aforementioned wire bonding process, the entire package is connected. Because ultrasonic vibration is employed in the bonding of a metallic wire onto the bonding pad, passivation layer or dielectric layer surrounding the bonding pad regions may crack due to stress concentration. In addition, the difference in coefficient of thermal expansion (CTE) between epoxy resin and the silicon chip during subsequent packaging may cause a further widening of the cracks already formed in the passivation layer or the dielectric layer.

One method of reducing uneven stress distribution within a semiconductor package is to form a plurality of bonding pad metallic layers in the desired bonding pad locations. The bonding pad metallic layers are similar in shape to bonding pads during interconnect fabrication. Plugs having a circular, rectangular or other shape arranged in a pre-defined array pattern are used to connect between the bonding pad metallic layers or the bonding pad metallic layer and the bonding pad. The bottommost layer also connects with the silicon substrate so that stress is evenly distributed over the entire wafer by the silicon substrate. Hence, the silicon wafer is less vulnerable to damages during subsequent processing.

Conventionally, a metallic plug is formed by conducting a plasma etching operation to remove a portion of the insulation layer and expose a portion of the bonding pad metallic layer and then refilling the opening with a metal. During a plasma etching operation, a portion of the electrical charges in the plasma may be transferred to the bonding pad metallic layer. These electrical charges may be transmitted to the devices via the conductive path between the bonding pad metallic layer and the devices.

In addition, a fixed number of plugs must be provided between the bonding pads and the bonding pad metallic layers or between the bonding pad metallic layers to ensure sufficient mechanical support for the bonding pads. However, the conductive current transmitted to the devices resulting from electric charges in the plasma is proportional to the number of plugs used. In other words, the larger number of metallic plugs used, the larger will be the total amount of electric charges collected by various bonding pad metallic layers. The flow of a large conduction current into the device may lead to device failure and a lowering of production yield.

Nevertheless, reducing conduction current by using fewer plugs between the bonding pad and the silicon substrate often leads to a drop in mechanical strength of the bonding pad. Damages rendered by subsequent processing may result in a higher production cost.

A method capable of increasing mechanical strength of the bonding pad without increasing corresponding conductive current is unavailable at present. Hence, only a compromised solution involving a balance between an acceptable conduction current, a minimum mechanical support for bonding pad and production cost can be sought.

SUMMARY OF THE INVENTION

Accordingly, one object of the present invention is to provide a bonding pad structure having a detached current conduction structure and mechanical support structure. The detached current conduction structure and mechanical support structure reduces the quantity of electric charges flowing to devices during etching but increases the mechanical strength of the bonding pad. Ultimately, product yield is increased and failure rate of subsequently processed silicon wafer is reduced.

To achieve these and other advantages and in accordance with the purpose of the invention, as embodied and broadly described herein, the invention provides a bonding pad structure. The bonding pad structure includes independently built current conduction structure and mechanical support structure between a bonding pad layer and a substrate. The current conduction structure is constructed using a plurality of serially connected conductive metallic layers, each at a different height between the bonding pad layer and the substrate. The conductive metallic layers connect with each other via a plurality of plugs. At least one of the conductive metallic layers connects electrically with a portion of the device in the substrate by a signal conduction line. The mechanical support structure is constructed using a plurality of serially connected supportive metallic layers each at a different height between the bonding pad layer and the substrate. The supportive metallic layers connect with each other via a plurality of plugs. Furthermore, the mechanical support structure connects with a non-device section of the substrate so that stresses on the bonding pads are distributed evenly through the substrate.

In this invention, since cross-sectional area of the conductive metallic layer in the current conduction structure is smaller than the bonding pad layer, the number of plugs connected to various conductive metallic layers can be reduced. Hence, current transmitted to the device via the current conduction structure will not exceed the permitted charge current during plasma etching. In other words, device breakdown due to excess charge flow is prevented leading to a higher yield and a lower production cost.

In addition, mechanical strength of the bonding pads is increased because both the mechanical support structure connected to the bonding pad layer and the current conduction structure are used in this invention. Since the mechanical support structure and the current conduction structure are connected together via the bonding pad layer only, electric charges absorbed when forming the plugs above the supporting metallic layer will not transmit to the current conduction structure. In this way, plug density can be increased to improve supportive strength of bonding pads. In the meantime, excessive current flowing to devices leading to device failures can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3 is a sketch showing a bonding pad structure fabricated according to a second preferred embodiment of this invention; and FIGS. 4 is a sketch showing a bonding pad structure fabricated according to a third preferred embodiment of this invention.

DESCRIPTION OF THE PREFERRED EMBODIMENTS

Figure 1:
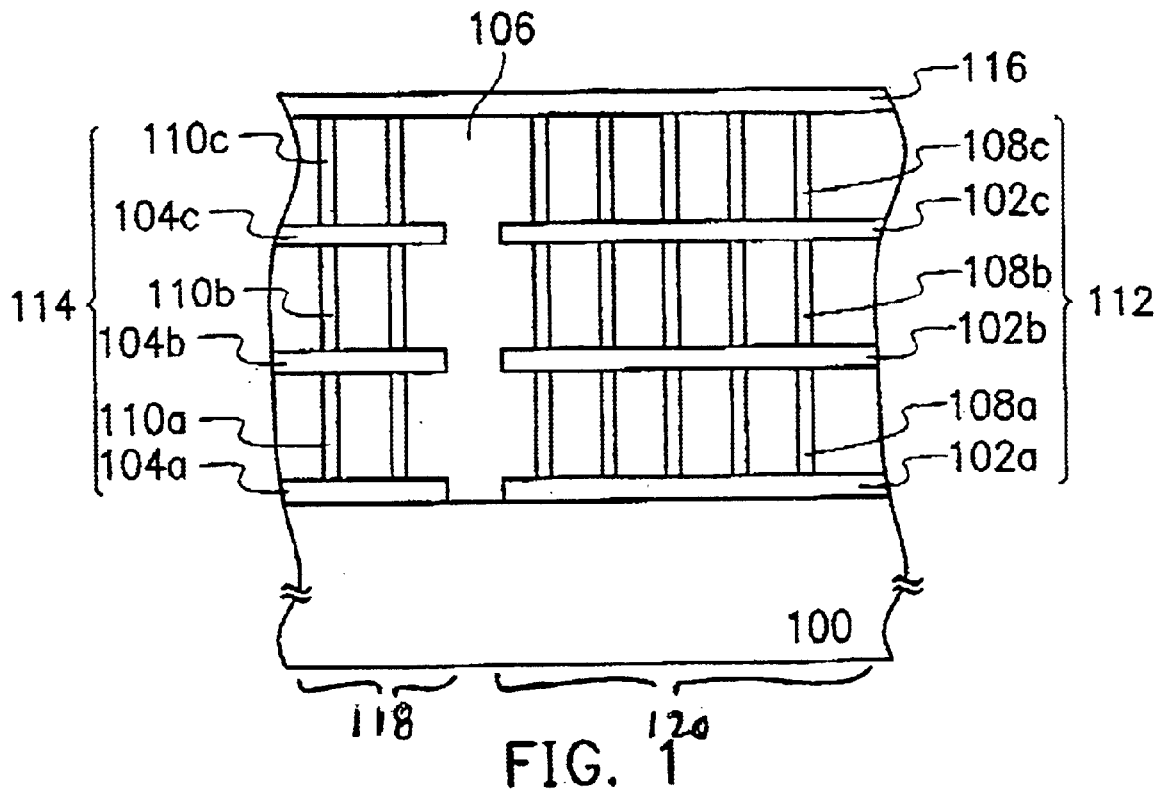
FIG. 1 is a sketch showing a bonding pad structure fabricated according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a sketch showing a bonding pad structure fabricated according to a first preferred embodiment of this invention. As shown in FIG. 1, the bonding structure includes a substrate 100, a mechanical support structure 112, a current conduction structure 114 and a bonding pad layer 116. The bonding pad layer 116 is above the substrate 100. The current conduction structure 114 is attached to the bonding pad layer 116 between the bonding pad layer 116 and the substrate 100. Similarly, the mechanical support structure 112 is also attached to the bonding pad layer 116 between the bonding pad layer 116 and the substrate 100. The substrate 100 can be a semiconductor substrate or a substrate with multi-layered interconnects therein.

The current conduction structure 114 and the mechanical support structure 112 are two detached structures connected only by the bonding layer 116. Furthermore, an insulation layer 106 is formed between the current conduction structure 114 and the mechanical support structure 112. The insulation layer 106 comprises more than one insulating material layer and the insulating material is silicon nitride, silicon oxide or silicon oxynitride.

The current conduction structure 114 includes a plurality of serially connected metallic layers 104a, 104b, 104c each located at a different height level between the bonding pad layer 116 and the substrate 100. The conductive metallic layers 104a, 104b, 104c are linked together via plugs 110a and 110b, respectively. The conductive metallic layer 104c and the bonding pad layer 116 are linked together via plugs 110c. The conductive metallic layer 104a is in contact with the substrate 100 so that the current conduction structure 114 actually connects the bonding pad layer 116 and the substrate 100 together. The conductive metallic layers 104a, 104b, 104c connect electrically with a signal line (not shown). Hence, the conductive metallic layers are electrically connected to a device section 118 on the substrate 100. The conductive metallic layers can be local metallic interconnects, for example.

The mechanical support structure 112 includes a plurality of serially connected support metallic layers 102a, 102b and 102c, each located at a different height level between the bonding pad layer 116 and the substrate 100. The support metallic layers 102a, 102b, 102c are linked together via plugs 108a and 108b. The support metallic layer 102c and the bonding pad layer 116 are linked together via plugs 108c. The support metallic layer 102a and the substrate 100 are in contact with each other to form the mechanical support structure 112 between the bonding pad layer 116 and the substrate 100. The support metallic layers can be local metallic interconnects, for example.

Since the bottom conductive metallic layer 104a of the current conduction structure 114 and the bottom support metallic layer 102a of the mechanical support structure 112 are formed on the substrate 100, stress on the bonding pad layer 116 is transmitted to the conductive metallic layer 104a and the support metallic layer 102a via the current conduction structure 114 and the mechanical support structure 112, respectively, and finally the stress is transmitted to the substrate 100 via the conductive metallic layer 104a and the support metallic layer 102a. Ultimately, stress is evenly distributed across the entire substrate 100.

Because cross-sectional area of the conductive metallic layers 104a, 104b, 104c in the current conduction structure 114 is smaller than that of a conventional bonding pad metallic layer, the number of plugs 110a, 110b, 110c attached to various conductive metallic layers 104a, 104b, 104c is smaller than the number of plugs attached to a conventional bonding pad metallic layer. Hence, overall in-processing current delivered to the device section of the substrate 100 via the current conduction structure 114 is greatly reduced. Ultimately, product yield is increased and production cost is lowered.

Besides the capacity to conduct current between the bonding pad layer 116 and the substrate 100, the current conduction structure 114 also has some mechanical support capacity. Through a special patterning of the plugs, the current conduction structure 114 can increase plug density of the mechanical support structure 112 so that bonding pad 116 has the capacity to support a greater load. In addition, the current conduction structure 114 and the mechanical support structure 112 are detached structures. Hence, an increase in plug density for the mechanical support structure 112 will not lead to an increase in current transmitted to the device section during plasma processing.

Furthermore, cross-sectional profile of the bonding pad 116, the conductive metallic layers 104a, 104b, 104c and the support metallic layers 102a, 102b, 102c can have any shape as corresponds to actual processing requirements. Similarly, cross-sectional profile of various plugs including 108a, 108b, 108c, 110a, 110b, and 110c can have any shape. Moreover, the plugs can be arranged in whatever pattern is suitable for a particular application.

Figure 2:
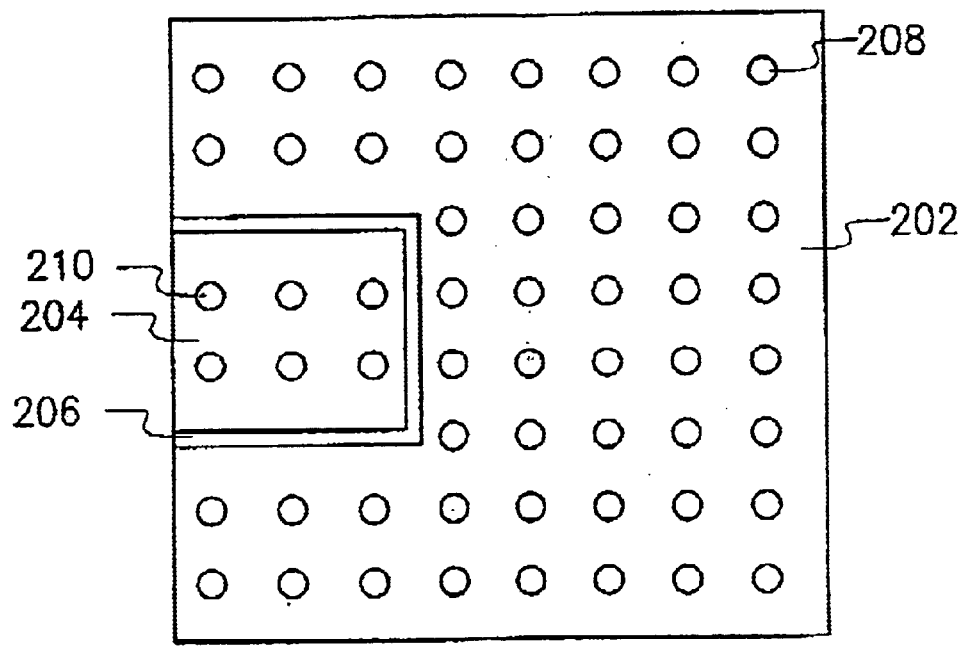
FIG. 2 is a cross-sectional view of the bonding pad structure as shown in FIG. 1.

FIG. 2 is a cross-sectional view of the bonding pad structure as shown in FIG. 1. As shown in FIG. 2, the bonding pad layer is rectangular, the plugs 208 and 210 have a circular top and the plugs 208 and 210 form a rectangular array. The aforementioned arrangement is used as an illustration only and is by no means to be construed as a limitation of this invention.

Because the conductive metallic layer 204 and the support metallic layer 202 correspond very much with the bonding pad layer, the number of plugs 210 distributed across the conductive metallic layers 204 is much smaller than the number of plugs 208 distributed across the support metallic layer 202 when the conductive metallic layer 204 has an area much smaller than the support metallic layer 202. The number of paths available for charges to flow into the devices is greatly reduced in the process of forming the plugs 210. Since the current flowing to the devices via the conductive metallic layer 204 will not exceed the capacity of the devices, device failure is reduced and product yield is increased.

In addition, area at the top of the support metallic layer 202 is only slightly smaller than that of a conventional bonding pad metallic layer. Moreover, the plugs 210 on the conductive metallic layer 204 have some capacity for supporting loads and hence the bonding pad stress supporting capacity in this invention is almost identical to that of a conventional design. Furthermore, the support metallic layer 202 has no direct contact with the device section on the substrate 200. Therefore, the number of plugs 208 on the support metallic layer 202 can be increased to support higher stress at the bonding pad.

Shape and size of the conductive metallic layers and the support metallic layers can be different from the ones shown in FIG. 2. For example, the conductive metallic layer can have an area greater than the support metallic layer or identical to the support metallic layer.

In the first embodiment, although a current conduction structure with three conductive metallic layers and a mechanical support structure with three support metallic layer are shown, there is no limitation to the total number of layers used. In general, a current conduction structure can have a multiple of conductive metallic layers and a mechanical support structure can have a multiple of support metallic layers between the bonding pad layer and the substrate.

FIGS. 3 is a sketch showing a bonding pad structure fabricated according to a second preferred embodiment of this invention. In the first embodiment, the substrate is in direct contact with a conductive metallic layer and a support metallic layer. In the second embodiment, however, the conductive metallic layer and the support metallic layer are in contact with the substrate via plugs. The following is a detailed description of the second embodiment of this invention.

As shown in FIG. 3, the bonding structure includes a substrate 300, a mechanical support structure 312, a current conduction structure 314 and a bonding pad layer 316. The bonding pad layer 316 is above the substrate 300. The current conduction structure 314 is attached to the bonding pad layer 316 between the bonding pad layer 316 and the substrate 300. Similarly, the mechanical support structure 312 is also attached to the bonding pad layer 316 between the bonding pad layer 316 and the substrate 300. The substrate 300 can be a semiconductor substrate or a substrate with multi-layered interconnects therein.

The current conduction structure 314 and the mechanical support structure 312 are two detached structures connected only by the bonding layer 316. Furthermore, an insulation layer 306 is formed between the current conduction structure 314 and the mechanical support structure 312. The insulation layer 306 comprises more than one insulating material layer and the insulating material is silicon nitride, silicon oxide or silicon oxynitride.

The current conduction structure 314 includes a plurality of serially connected metallic layers 304a, 304b and 304c, each located at a different height level between the bonding pad layer 316 and the substrate 300. The conductive metallic layers 304a, 304b, 304c are linked together via plugs 310b and 310c, respectively. The conductive metallic layer 304c and the bonding pad layer 316 are linked together via plugs 310d. The conductive metallic layer 304a and the substrate 300 are linked together via plugs 310a to form a current conduction structure 314 between the bonding pad layer 316 and the substrate 300. The conductive metallic layers 304a, 304b, 304c connect electrically with a signal line (not shown). Hence, the conductive metallic layers are electrically connected to a device section (not shown) on substrate 300. The conductive metallic layers 304a, 304b and 304c can be local metallic interconnects, for example.

The mechanical support structure 312 includes a plurality of serially connected support metallic layers 302a, 302b and 302c, each located at a different height level between the bonding pad layer 316 and the substrate 300. The support metallic layers 302a, 302b, 302c are linked together via plugs 308b and 308c. The support metallic layer 302c and the bonding pad layer 316 are linked together via plugs 308d. The support metallic layer 302a and the substrate 300 are linked together via plugs 308a to form a mechanical support structure 314 between the bonding pad layer 316 and the substrate 300. The support metallic layers can be a local metallic interconnects, for example.

Since the plugs 310a of the current conduction structure 314 and the plugs 308a of the mechanical support structure 312 are formed on the substrate 300, stress on the bonding pad layer 316 is transmitted to the plugs 310a and the plugs 308a via the current conduction structure 314 and the mechanical support structure 312, respectively. Finally, the stress is transmitted to the substrate 300 via the plugs 310a and 308a so that stress is evenly distributed across the entire substrate 100.

Because cross-sectional area of the conductive metallic layers 304a, 304b, 304c in the current conduction structure 314 is smaller than a conventional bonding pad metallic layer, the number of plugs 310b, 310c, 310d attached to various conductive metallic layers 304a, 304b, 304c is smaller than the number of plugs attached to a conventional bonding pad metallic layer. Hence, overall in-processing current delivered to the device section of the substrate 300 via the current conduction structure 314 is greatly reduced. Ultimately, product yield is increased and production cost is lowered.

Besides the capacity to conduct current between the bonding pad layer 316 and the substrate 300, the current conduction structure 314 also has some mechanical support capacity. Through a special patterning of the plugs 310a, 310b, 310c and 310d, the current conduction structure 314 can increase plug density of the mechanical support structure 312 so that bonding pad 316 has the capacity to support a greater load. In addition, the current conduction structure 314 and the mechanical support structure 312 are detached structures. Hence, an increase in plug density for the mechanical support structure 312 will not lead to an increase in current transmitted to the device section during plasma processing.

Furthermore, cross-sectional profile of the bonding pad 316, the conductive metallic layers 304a, 304b, 304c and the support metallic layers 302a, 302b, 302c can have any shape according to actual processing requirements. Similarly, cross-sectional profiles of various plugs including 308a, 308b, 308c, 308d, 310a, 310b, 310c and 310d can have any shape. Moreover, the plugs can be arranged in whatever pattern is suitable for a particular application.

In the second embodiment, although a current conduction structure with three conductive metallic layers and a mechanical support structure with three support metallic layer are shown, there is no limitation to the total number of layers used. In general, a current conduction structure can have a multiple of conductive metallic layers and a mechanical support structure can have a multiple of support metallic layers between the bonding pad layer and the substrate.

FIGS. 4 is a sketch showing a bonding pad structure fabricated according to a third preferred embodiment of this invention. In the first embodiment, the number of conductive metallic layers and the number of support metallic layers are identical. In the third embodiment, however, the number of conductive metallic layers is different from the number of support metallic layers. The following is a detailed description of the second embodiment of this invention.

As shown in FIG. 4, the bonding structure includes a substrate 400, a mechanical support structure 412, a current conduction structure 414 and a bonding pad layer 416. The bonding pad layer 416 is above the substrate 400. The current conduction structure 414 is attached to the bonding pad layer 416 between the bonding pad layer 416 and the substrate 400. Similarly, the mechanical support structure 412 is also attached to the bonding pad layer 416 between the bonding pad layer 416 and the substrate 400. The substrate 400 can be a semiconductor substrate or a substrate with multi-layered interconnects therein.

The current conduction structure 414 and the mechanical support structure 412 are two detached structures connected only by the bonding layer 416. Furthermore, an insulation layer 406 is formed between the current conduction structure 414 and the mechanical support structure 412. The insulation layer 406 comprises of more than one insulating material layer and the insulating material is silicon nitride, silicon oxide or silicon oxynitride.

The current conduction structure 414 includes a plurality of serially connected metallic layers 404a and 404b, each located at a different height level between the bonding pad layer 416 and the substrate 400. The conductive metallic layers 404a, 404b are linked together via plugs 410a. The conductive metallic layer 404b and the bonding pad layer 416 are linked together via plugs 410b. The conductive metallic layer 404a is in contact with the substrate 400 so that the current conduction structure 414 actually connects the bonding pad layer 416 and the substrate 400 together. The conductive metallic layers 404a, 404b connect electrically with a signal line (not shown). Hence, the conductive metallic layers are electrically connected to a device section (not shown) on substrate 400. The conductive metallic layers can be local metallic interconnects, for example.

The mechanical support structure 412 includes a plurality of serially connected support metallic layers 402a, 402b, 402c each located at a different height level between the bonding pad layer 416 and the substrate 400. The support metallic layers 402a, 402b, 402c are linked together via plugs 408a and 408b. The support metallic layer 402c and the bonding pad layer 416 are linked together via plugs 408c. The support metallic layer 402a and the substrate 400 are in contact with each other to form the mechanical support structure 412 between the bonding pad layer 416 and the substrate 400. The support metallic layers can be local metallic interconnects, for example.

Since the bottom conductive metallic layer 404a of the current conduction structure 414 and the bottom support metallic layer 402a of the mechanical support structure 412 are formed on the substrate 400, stress on the bonding pad layer 416 is transmitted to the conductive metallic layer 404a and the support metallic layer 402a via the current conduction structure 414 and the mechanical support structure 412, respectively. The stress is transmitted to the substrate 400 via the conductive metallic layer 404a and the support metallic layer 402a. Ultimately, stress is evenly distributed across the entire substrate 400.

When the cross-sectional area of the conductive metallic layers in the current conduction structure 414 is much smaller than the cross-sectional area of the support metallic layers in the mechanical support structure 412, the number of conductive metallic layer in the current conduction structure 414 cannot be identical to the number of support metallic layer in the mechanical support structure 412. This is because the purpose of the current conduction structure 414 is to provide an electrical path between the bonding pad layer and the substrate devices. The stress supporting capacity of the current conduction structure 414 is of secondary importance. The effect of having a number of conductive metallic layers in the current conduction structure that differs from the number of support metallic layer is relatively small.

Furthermore, cross-sectional profile of the bonding pad 416, the conductive metallic layers 404a, 404b and the support metallic layers 402a, 402b, 402c can have any shape according to actual processing requirements. Similarly, cross-sectional profile of various plugs including 408a, 408b, 408c, 410a, and 410b can have any shape. Moreover, the plugs can be arranged in whatever pattern suitable for a particular application.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bonding pad structure, comprising:
   a substrate having at least a device section and a non-device section;
   a bonding pad layer above the substrate;
   a current conduction structure over the device section, between the bonding pad layer and the substrate for connecting the bonding pad layer and the substrate electrically, wherein the current conduction structure includes:

a plurality of conductive metallic layers, wherein each conductive metallic layer is at a different height level from the substrate; and a plurality of conductive plugs for linking neighboring conductive metallic layers and the conductive metallic layers with the bonding pad layer and the substrate;

a mechanical support structure connecting with the non-device section of the substrate, between the bonding pad layer and the substrate, wherein the mechanical support structure includes:

a plurality of support metallic layers, wherein each support metallic layer is at a different height level from the substrate; and a plurality of support plugs for linking up neighboring support metallic layers and the support metallic layers with the bonding pad layer and the substrate; and an insulation layer between the bonding pad layer, the current conduction structure, the mechanical support structure and the substrate for isolating the current conduction structure from the mechanical support structure.

2. The bonding pad structure of claim 1, wherein each conductive metallic layer in the current conduction structure has a smaller cross-sectional area than each support metallic layer in the mechanical support structure.

3. The bonding pad structure of claim 1, wherein number of conductive metallic layers in the current conduction structure and number of support metallic layers in the mechanical support structure are identical.

4. The bonding pad structure of claim 1, wherein each conductive metallic layer in the current conduction structure and a corresponding support metallic layer in the mechanical support structure are at an identical height level.

5. The bonding pad structure of claim 1, wherein number of conductive metallic layers in the current conduction structure differs from number of support metallic layers in the mechanical support structure.

6. The bonding pad structure of claim 1, wherein the conductive plugs between neighboring conductive metallic layers, the conductive plugs between the conductive metallic layer and the bonding pad and the conductive plugs between the conductive metallic layer and the substrate are evenly distributed.

7. The bonding pad structure of claim 1, wherein the support plugs between neighboring support metallic layers, the support plugs between the support metallic layer and the bonding pad and the support plugs between the support metallic layer and the substrate are evenly distributed.

8. A bonding pad structure, comprising:

a substrate having at least a device section and a non-device section;

a bonding pad layer above the substrate; the substrate for connecting the bonding pad layer and the substrate electrically, wherein the current conduction structure includes:

a plurality of conductive metallic layer, wherein each conductive metallic layer is at a different height level from the substrate and one of the conductive metallic layers is in direct contact with the substrate; and a plurality of conductive plugs for linking neighboring conductive metallic layers and linking one of the conductive metallic layers with the bonding pad layer;

a mechanical support structure connecting with the non-device section of the substrate, between the bonding pad layer and the substrate, wherein the mechanical support structure includes:

a plurality of support metallic layers, wherein each support metallic layer is at a different height level from the substrate and one of the support metallic layers is in direct contact with the substrate; and a plurality of support plugs for linking neighboring support metallic layers and linking one of the support metallic layers with the bonding pad layer; and an insulation layer between the bonding pad layer, the current conduction structure, the mechanical support structure and the substrate for isolating the current conduction structure from the mechanical support structure.

9. The bonding pad structure of claim 8, wherein a cross-sectional area of each conductive metallic layer in the current conduction structure differs from a cross-sectional area of each support metallic layer in the mechanical support structure.

10. The bonding pad structure of claim 8, wherein each conductive metallic layer in the current conduction structure and each support metallic layer in the mechanical support structure has an identical cross-sectional area.

11. The bonding pad structure of claim 8, wherein number of conductive metallic layers in the current conduction structure and number of support metallic layers in the mechanical support structure are identical.

12. The bonding pad structure of claim 8, wherein each conductive metallic layer in the current conduction structure and a corresponding support metallic layer in the mechanical support structure are at an identical height level.

13. The bonding pad structure of claim 8, wherein number of conductive metallic layers in the current conduction structure differs from number of support metallic layers in the mechanical support structure.

14. The bonding pad structure of claim 8, wherein the conductive plugs between neighboring conductive metallic layers and the conductive plugs between the conductive metallic layer and the bonding pad are evenly distributed.

15. The bonding pad structure of claim 8, wherein the support plugs between neighboring support metallic layers and the support plugs between the support metallic layer and the bonding pad are evenly distributed.

* * * * *